US008965000B2

(12) United States Patent
Engdegard

(10) Patent No.: US 8,965,000 B2
(45) Date of Patent: Feb. 24, 2015

(54) METHOD AND APPARATUS FOR APPLYING REVERB TO A MULTI-CHANNEL AUDIO SIGNAL USING SPATIAL CUE PARAMETERS

(75) Inventor: Jonas Engdegard, Stockholm (SE)

(73) Assignee: Dolby International AB, Amsterdam (NL)

( * ) Notice: Subject to any disclaimer, the term of this patent is extended or adjusted under 35 U.S.C. 154(b) by 621 days.

(21) Appl. No.: 13/132,321

(22) PCT Filed: Dec. 16, 2009

(86) PCT No.: PCT/EP2009/067350

§ 371 (c)(1), (2), (4) Date: Jul. 19, 2011

(87) PCT Pub. No.: WO2010/070016

PCT Pub. Date: Jun. 24, 2010

(65) Prior Publication Data

US 2011/0261966 A1 Oct. 27, 2011

Related U.S. Application Data

(60) Provisional application No. 61/172,855, filed on Apr. 27, 2009.

(30) Foreign Application Priority Data

Dec. 19, 2008 (SE) ........................................ 0802629

(51) Int. Cl.
*H03G 3/00* (2006.01)
*G10L 19/008* (2013.01)
*H04S 7/00* (2006.01)

(52) U.S. Cl.
CPC ............... *G10L 19/008* (2013.01); *H04S 7/305* (2013.01)
USPC ................................ 381/63; 381/310; 381/17

(58) Field of Classification Search
USPC ........ 381/63, 310, 119, 17–23; 704/500–502; 84/630, 707; 700/94
See application file for complete search history.

(56) References Cited

U.S. PATENT DOCUMENTS 7,382,886 B2 6/2008 Henn
7,487,097 B2 2/2009 Engdegard
(Continued)

FOREIGN PATENT DOCUMENTS

CN 101263742 9/2008
EP 1775996 4/2007
(Continued)

OTHER PUBLICATIONS

Frenette, J. "Reducing Artificial Reverberation Requirements Using Time-Variant Feedback Delay Networks" published on Dec. 1, 2000 on 130 sheets.

(Continued)

*Primary Examiner* — Joseph Saunders, Jr.
*Assistant Examiner* — James Mooney

(57) ABSTRACT

A method and system for applying reverb to an M-channel downmixed audio input signal indicative of X individual audio channels, where X is greater than M. Typically, the method includes steps of: in response to spatial cue parameters indicative of spatial image of the downmixed input signal, generating Y discrete reverb channel signals, where each of the reverb channel signals at a time, t, is a linear combination of at least a subset of values of the individual audio channels at the time, t, and individually applying reverb to each of at least two of the reverb channel signals, thereby generating Y reverbed channel signals.

23 Claims, 3 Drawing Sheets

(56) References Cited

U.S. PATENT DOCUMENTS

| | | | | |
|---|---|---|---|---|
| 7,564,978 | B2 | 7/2009 | Engdegard | |
| 2005/0100171 | A1* | 5/2005 | Reilly et al. | 381/63 |
| 2007/0213990 | A1 | 9/2007 | Moon | |
| 2007/0223708 | A1 | 9/2007 | Villemoes | |
| 2007/0223749 | A1 | 9/2007 | Kim | |
| 2007/0280485 | A1 | 12/2007 | Villemoes | |
| 2008/0025519 | A1 | 1/2008 | Robinson et al. | |
| 2008/0037795 | A1 | 2/2008 | Ko | |
| 2008/0071549 | A1 | 3/2008 | Chong | |
| 2008/0137875 | A1* | 6/2008 | Zong et al. | 381/63 |
| 2008/0205658 | A1* | 8/2008 | Breebaart | 381/17 |
| 2009/0010460 | A1* | 1/2009 | Diedrichsen | 381/300 |

FOREIGN PATENT DOCUMENTS

| | | |
|---|---|---|
| JP | 2001-352599 | 12/2001 |
| JP | 2007-336080 | 12/2007 |
| JP | 2008-301427 | 12/2008 |
| RU | 2038704 | 6/1995 |
| RU | 2316154 | 1/2008 |
| RU | 2007118674 | 11/2008 |
| WO | 95/05724 | 2/1995 |
| WO | 03/085643 | 10/2003 |
| WO | 2006/045373 | 5/2006 |
| WO | 2007-009548 | 1/2007 |
| WO | 2007/031905 | 3/2007 |
| WO | 2007031171 | 3/2007 |
| WO | 2007031896 | 3/2007 |
| WO | 2007096808 | 3/2007 |
| WO | 2008/125322 | 10/2008 |

OTHER PUBLICATIONS

Engdegard, et al., "Synthetic Ambience in Parametric Stereo Coding" AES Convention Paper presented at the 116th Convention, May 8-11, 2004, Berlin, Germany, pp. 1-12.

Virette, et al., "Efficient Binaural Filtering in QMF Domain for BRIR" AES Convention Paper 7095 presented at the 122nd Convention May 5-8, 2007, Vienna, Austria, pp. 1-12.

Purnhagen, et al., "A Novel Approach to Up-Mix Stereo to Surround Based on MPEG Surround Technology" AES Convention Paper 6991, presented at the 122nd Convention May 5-8, 2007, Vienna, Austria, pp. 1-9.

Walther, et al., "Using Transient Suppression in Blind Multi-Channel Upmix Algorithms" AES Convention Paper 6990, presented at the 122nd Convention, May 5-8, 2007, Vienna, Austria, pp. 1-10.

Zoelzer, et al., "Multirate Digital Reverbation System" AES presented at the 89th Convention Sep. 21-25, 1990 Los Angeles, CA, pp. 1-13.

Nikolic, Igor, "Improvements of Artificial Reverberation by Use of Subband Feedback Delay Networks" AES Convention Paper 5630 presented at the 112th Convention May 10-13, 2002 Munich, Germany, pp. 1-9.

* cited by examiner

METHOD AND APPARATUS FOR APPLYING REVERB TO A MULTI-CHANNEL AUDIO SIGNAL USING SPATIAL CUE PARAMETERS

BACKGROUND OF THE INVENTION

1. Field of the Invention

The invention relates to methods and systems for applying reverb to a multi-channel downmixed audio signal indicative of a larger number of individual audio channels. In some embodiments, this is done by upmixing the input signal and applying reverb to at least some of its individual channels in response to at least one spatial cue parameter (indicative of least one spatial cue for the input signal) so as to apply different reverb impulse responses for each of the individual channels to which reverb is applied. Optionally, after application of reverb the individual channels are downmixed to generate an N-channel reverbed output signal. In some embodiments the input signal is a QMF (quadrature mirror filter) domain MPEG Surround (MPS) encoded signal, and the upmixing and reverb application are performed in the QMF domain in response to MPS spatial cue parameters including at least some of Channel Level Difference (CLD), Channel Prediction Coefficient (CPC), and Inter-channel Cross Correlation (ICC) parameters.

2. Background of the Invention

Throughout this disclosure including in the claims, the expression "reverberator" (or "reverberator system") is used to denote a system configured to apply reverb to an audio signal (e.g., to all or some channels of a multi-channel audio signal).

Throughout this disclosure including in the claims, the expression "system" is used in a broad sense to denote a device, system, or subsystem. For example, a subsystem that implements a reverberator may be referred to as a reverberator system (or reverberator), and a system including such a reverberator subsystem (e.g., a decoder system that generates X+Y output signals in response to Q+R inputs, in which the reverberator subsystem generates X of the outputs in response to Q of the inputs and the other outputs are generated in another subsystem of the decoder system) may also be referred to as a reverberator system (or reverberator).

Throughout this disclosure including in the claims, the expression "reproduction" of signals by speakers denotes causing the speakers to produce sound in response to the signals, including by performing any required amplification and/or other processing of the signals.

Throughout this disclosure including in the claims, the expression "linear combination" of values $v_1, v_2, \ldots, v_n$, (e.g., n elements of a subset of a set of X individual audio channel signals occurring at a time, t, where n is less than or equal to X) denotes a value equal to $a_1v_1+a_2v_2+\ldots+a_nv_n$, where $a_1, a_2, \ldots, a_n$ are coefficients. In general, there is no restriction on the values of the coefficients (e.g., each coefficient can be positive or negative or zero). The expression is used in a broad sense herein, for example to cover the case that one of the coefficients is equal to 1 and the others are equal to zero (e.g., the case that the linear combination $a_1v_1+a_2v_2+\ldots+a_nv_n$ is equal to $v_1$ (or $v_2, \ldots$, or $v_n$).

Throughout this disclosure including in the claims, the expression "spatial cue parameter" of a multichannel audio signal denotes any parameter indicative of at least one spatial cue for the audio signal, where each such "spatial cue" is indicative (e.g., descriptive) of the spatial image of the multichannel signal. Examples of spatial cues are level (or intensity) differences between (or ratios of) pairs of the channels of the audio signal, phase differences between such channel pairs, and measures of correlation between such channel pairs. Examples of spatial cue parameters are the Channel Level Difference (CLD) parameters and Channel Prediction Coefficient (CPC) parameters which are part of a conventional MPEG Surround ("MPS") bitstream, and which are employed in MPEG surround coding.

In accordance with the well known MPEG Surround ("MPS") standard, multiple channels of audio data can be encoded by being downmixed into a smaller number of channels (e.g., M channels, where M is typically equal to 2) and compressed, and such an M-channel downmixed audio signal can be decoded by being decompressed and processed (upmixed) to generate N decoded audio channels (e.g., M=2 and N=5).

A typical, conventional MPS decoder is operable to perform upmixing to generate N decoded audio channels (where N is greater than two) in response to a time-domain, 2-channel, downmixed audio input signal (and MPS spatial cue parameters including Channel Level Difference and Channel Prediction Coefficient parameters). A typical, conventional MPS decoder is operable in a binaural mode to generate a binaural signal in response to a time-domain, 2-channel, downmixed audio input signal and spatial cue parameters, and in at least one other mode to perform upmixing to generate 5.0 (where the notation "x.y" channels denotes "x" full frequency channels and "y" subwoofer channels), 5.1, 7.0, or 7.1 decoded audio channels in response to a time-domain, 2-channel, downmixed audio input signal and spatial cue parameters. The input signal undergoes time domain-to-frequency domain transformation into the QMF (quadrature mirror filter) domain, to generate two channels of QMF domain frequency components. These frequency components undergo decoding in the QMF domain and the resulting frequency components are typically then transformed back into the time domain to generate the audio output of the decoder.

FIG. 1 is a simplified block diagram of elements of a conventional MPS decoder configured to generate N decoded audio channels (where N is greater than two, and N is typically equal to 5 or 7) in response to a 2-channel downmixed audio signal (L' and R') and MPS spatial cue parameters (including Channel Level Difference parameters and Channel Prediction Coefficient parameters). The downmixed input signal (L' and R') is indicative of "X" individual audio channels, where X is greater than 2. The downmixed input signal is typically indicative of five individual channels (e.g., left-front, right-front, center, left-surround, and right-surround channels).

Each of the "left" input signal L' and the "right" input signal R' is a sequence of QMF domain frequency components generated by transforming a 2-channel, time-domain MPS encoded signal (not indicated in FIG. 1) in a time domain-to-QMF domain transform stage (not shown in FIG. 1).

The downmixed input signals L' and R' are decoded into N individual channel signals S1, S2, . . . , SN, in decoder 1 of FIG. 1, in response to the MPS spatial cue parameters which are asserted (with the input signals) to the FIG. 1 system. The N sequences of output QMF domain frequency components, S1, S2, . . . , SN are typically transformed back into the time domain by a QMF domain-to-time domain transform stage (not shown in FIG. 1), and can be asserted as output from the system without undergoing post-processing. Optionally, the signals S1, S2, . . . , SN undergo post-processing (in the QMF domain) in post-processor 5 to generate an N-channel audio output signal comprising channels OUT1, OUT2, . . . , OUTN. The N sequences of output QMF domain frequency components, OUT1, OUT2, . . . , OUTN, are typically transformed back into the time domain by a QMF domain-to-time domain transform stage (not shown in FIG. 1), and asserted as output from the system.

The conventional MPS decoder of FIG. 1 operating in a binaural mode generates 2-channel binaural audio output S1 and S2, and optionally also 2-channel binaural audio output OUT1 and OUT2, in response to a 2-channel downmixed audio signal (L' and R') and MPS spatial cue parameters (including Channel Level Difference parameters and Channel Prediction Coefficient parameters). When reproduced by a pair of headphones, the 2-channel audio output S1 and S2 is perceived at the listener's eardrums as sound from "X" loudspeakers (where X>2 and X is typically equal to 5 or 7) at any of a wide variety of positions (determined by the coefficients of decoder 1), including positions in front of and behind the listener. In the binaural mode, post-processor 5 can apply reverb to the 2-channel output (S1, S2) of decoder 1 (in this case, post-processor 5 implements an artificial reverberator). The FIG. 1 system could be implemented (in a manner to be described below) so that the 2-channel output of post-processor 5 (OUT1 and OUT2) is a binaural audio output to which reverb has been applied, and which when reproduced by headphones is perceived at the listener's eardrums as sound from "X" loudspeakers (where X>2 and X is typically equal to 5) at any of a wide variety of positions, including positions in front of and behind the listener.

Reproduction of signals S1 and S2 (or OUT1 and OUT2) generated during binaural mode operation of the FIG. 1 decoder can give the listener the experience of sound that comes from more than two (e.g., five) "surround" sources. At least some of these sources are virtual. More generally, it is conventional for virtual surround systems to use head-related transfer functions (HRTFs) to generate audio signals (sometimes referred to as virtual surround sound signals) that, when reproduced by a pair of physical speakers (e.g., loudspeakers positioned in front of a listener, or headphones) are perceived at the listener's eardrums as sound from more than two sources (e.g., speakers) at any of a wide variety of positions (typically including positions behind the listener).

As noted, the MPS decoder of FIG. 1 operating in the binaural mode could be implemented to apply reverb using an artificial reverberator implemented by post-processor 5. This reverberator could be configured to generate reverb in response to the two-channel output (S1, S2) of decoder 1 and to apply the reverb to the signals S1 and S2 to generate reverbed two-channel audio OUT1 and OUT2. The reverb would be applied as a post process stereo-to-stereo reverb to the 2-channel signal S1, S2 from decoder 1, such that the same reverb impulse response is applied to all discrete channels determined by one of the two downmixed audio channels of the binaural audio output of decoder 1 (e.g., to left-front and left-surround channels determined by downmixed channel S1), and the same reverb impulse response is applied to all discrete channels determined by the other one of the two downmixed audio channels of the binaural audio (e.g., to right-front and right-surround channels determined by downmixed channel S2).

One type of conventional reverberator has what is known as a Feedback Delay Network-based (FDN-based) structure. In operation, such a reverberator applies reverb to a signal by feeding back to the signal a delayed version of the signal. An advantage of this structure relative to other reverb structures is the ability to efficiently produce and apply multiple uncorrelated reverb signals to multiple input signals. This feature is exploited in the commercially available Dolby Mobile headphone virtualizer which includes a reverberator having FDN-based structure and is operable to apply reverb to each channel of a five-channel audio signal (having left-front, right-front, center, left-surround, and right-surround channels) and to filter each reverbed channel using a different filter pair of a set of five head related transfer function ("HRTF") filter pairs. This virtualizer generates a unique reverb impulse response for each audio channel.

The Dolby Mobile headphone virtualizer is also operable in response to a two-channel audio input signal, to generate a two-channel "reverbed" audio output (a two-channel virtual surround sound output to which reverb has been applied). When the reverbed audio output is reproduced by a pair of headphones, it is perceived at the listener's eardrums as HRTF-filtered, reverbed sound from five loudspeakers at left front, right front, center, left rear (surround), and right rear (surround) positions. The virtualizer upmixes a downmixed two-channel audio input (without using any spatial cue parameter received with the audio input) to generate five upmixed audio channels, applies reverb to the upmixed channels, and downmixes the five reverbed channel signals to generate the two-channel reverbed output of the virtualizer. The reverb for each upmixed channel is filtered in a different pair of HRTF filters.

US Patent Application Publication No. 2008/0071549 A1, published on Mar. 20, 2008, describes another conventional system for applying a form of reverb to a downmixed audio input signal during decoding of the downmixed signal to generate individual channel signals. This reference describes a decoder which transforms time-domain downmixed audio input into the QMF domain, applies a form of reverb to the downmixed signal M(t,f) in the QMF domain, adjusts the phase of the reverb to generate a reverb parameter for each upmix channel being determined from the downmixed signal (e.g., to generate reverb parameter $L_{reverb}(t, f)$ for an upmix left channel, and reverb parameter $R_{reverb}(t, f)$ for an upmix right channel, being determined from the downmixed signal M(t,f)). The downmixed signal is received with spatial cue parameters (e.g., an ICC parameter indicative of correlation between left and right components of the downmixed signal, and inter-channel phase difference parameters $IPD_L$ and $IPD_R$). The spatial cue parameters are used to generate the reverb parameters (e.g., $L_{reverb}(t, f)$ and $R_{reverb}(t, f)$). Reverb of lower magnitude is generated from the downmixed signal M(t,f) when the ICC cue indicates that there is more correlation between left and right channel components of the downmixed signal, reverb of greater magnitude is generated from the downmixed signal when the ICC cue indicates that there is less correlation between the left and right channel components of the downmixed signal, and apparently the phase of each reverb parameter is adjusted (in block 206 or 208) in response to the phase indicated by the relevant IPD cue. However, the reverb is used only as a decorrelator in a parametric stereo decoder (mono-to-stereo synthesis) where the decorrelated signal (which is orthogonal to M(t,f)) is used to reconstruct the left-right cross correlation, and the reference does not suggest individually determining (or generating) a different reverb signal, for application to each of discrete channels of an upmix determined from the downmixed audio M(t,f) or to each of a set of linear combinations of values of individual upmix channels determined from the downmixed audio, from each of the discrete channels of the upmix or each of such linear combinations.

The inventor has recognized that it would be desirable to individually determine (and generate) a different reverb signal for each of the discrete channels of an upmix determined from downmixed audio, from each of the discrete channels of the upmix, or to determine and generate a different reverb signal for (and from) each of a set of linear combinations of values of such discrete channels. The inventor has also recognized that with such individual determination of reverb signals for the individual upmix channels (or linear combinations of values of such channels), reverb having a different reverb impulse response can be applied to the upmix channels (or linear combinations).

Until the present invention, spatial cue parameters received with downmixed audio had not been used both to generate discrete, upmix channels from the downmixed audio (e.g., in the QMF domain when the downmixed audio is MPS encoded audio) or linear combinations of values thereof, and to generate reverb from each such upmix channel (or linear combination) individually for application to said upmix channel (or linear combination). Nor had reverbed upmix channels that had been generated in this way been recombined to generate reverbed, downmixed audio from input downmixed audio.

BRIEF DESCRIPTION OF THE INVENTION

In a class of embodiments, the invention is a method for applying reverb to an M-channel downmixed audio input signal indicative of X individual audio channels, where X is a number greater than M. In these embodiments the method includes the steps of:

(a) in response to spatial cue parameters indicative (e.g., descriptive) of the spatial image of the downmixed input signal, generating Y discrete reverb channel signals (e.g., in the quadrature mirror filter or "QMF" domain), where each of the reverb channel signals at a time, t, is a linear combination of at least a subset of values of the X individual audio channels at the time, t; and (b) individually applying reverb to each of at least two of the reverb channel signals (e.g., in the QMF domain), thereby generating Y reverbed channel signals. Preferably, the reverb applied to at least one of the reverb channel signals has a different reverb impulse response than does the reverb applied to at least one other one of the reverb channel signals. In some embodiments, X=Y, but in other embodiments X is not equal to Y. In some embodiments, Y is greater than M, and the input signal is upmixed in step (a) in response to the spatial cue parameters to generate the Y reverb channel signals. In other embodiments, Y is equal to M or Y is less than M.

For example, in one case in which M=2, X=5, and Y=4, the input signal is a sequence of values L(t), R(t) indicative of five individual channel signals, $L_{front}$, $R_{front}$, C, $L_{sur}$, and $R_{sur}$. Each of the five individual channel signals is a sequence of values $$(\,L_{front}\quad R_{front}\quad C\quad L_{surr}\quad R_{surr}\,)^{t} = W\begin{pmatrix} L \\ R \end{pmatrix},$$

where W is an MPEG Surround upmix matrix of form $$W = \begin{pmatrix} g_{lf}w_{11} & g_{lf}w_{12} \\ g_{rf}w_{21} & g_{rf}w_{22} \\ w_{31} & w_{32} \\ g_{ls}w_{11} & g_{ls}w_{12} \\ g_{rs}w_{21} & g_{rs}w_{22} \end{pmatrix},$$

and the four reverb channel signals are $(g_{lf}w_{11})L+(g_{lf}w_{12})R$, $(g_{rf}w_{21})L+(g_{rf}w_{22})R$, $(g_{is}w_{11})L+(g_{is}w_{12})R$, and $(g_{rs}w_{21}+w_{31})L+(g_{rs}w_{22}+w_{32})R$, which can be represented as:

$$B\begin{pmatrix} L \\ R \end{pmatrix} = B_0W\begin{pmatrix} L \\ R \end{pmatrix} = \begin{pmatrix} g_{lf}w_{11} & g_{lf}w_{12} \\ g_{rf}w_{21} & g_{rf}w_{22} \\ g_{ls}w_{11} & g_{ls}w_{12} \\ g_{rs}w_{21}+w_{31} & g_{rs}w_{22}+w_{32} \end{pmatrix}\begin{pmatrix} L \\ R \end{pmatrix}, \text{ where}$$

$$B_0 = \begin{pmatrix} 1 & 0 & 0 & 0 & 0 \\ 0 & 1 & 0 & 0 & 0 \\ 0 & 0 & 0 & 1 & 0 \\ 0 & 0 & 1 & 0 & 1 \end{pmatrix}.$$

In some embodiments in which the input signal is an M-channel, MPEG Surround ("MPS") downmixed signal, steps (a) and (b) are performed in the QMF domain, and the spatial cue parameters are received with the input signal. For example, the spatial cue parameters may be or include Channel Level Difference (CLD) parameters and/or Channel Prediction Coefficient (CPC) parameters of the type comprising part of a conventional MPS bitstream. When the input signal is a time-domain, MPS downmixed signal, the invention typically includes the step of transforming this time-domain signal into the QMF domain to generate QMF domain frequency components, and performing steps (a) and (b) in the QMF domain on these frequency components.

Optionally, the method also includes a step of generating an N-channel downmixed version of the Y reverbed channel signals (including each of the channel signals to which reverb has been applied and each of the channel signals, if any, to which reverb has not been applied), for example by encoding the reverbed channel signals as an N-channel, downmixed MPS signal.

In typical embodiments of the inventive method, the input downmixed signal is a 2-channel downmixed MPEG Surround ("MPS") signal indicative of five individual audio channels (left-front, right-front, center, left-surround, and right surround channels), and reverb determined by a different reverb impulse response is applied to each of at least some of these five channels, resulting in improved surround sound quality.

Preferably, the inventive method also includes a step of applying to the reverbed channel signals corresponding head-related transfer functions (HRTFs), by filtering the reverbed channel signals in an HRTF filter. The HRTFs are applied to make the listener perceive the reverb applied in accordance with the invention as being more natural sounding.

Other aspects of the invention are a reverberator configured (e.g., programmed) to perform any embodiment of the inventive method, a virtualizer including such a reverberator, a decoder (e.g., an MPS decoder) including such a reverberator, and a computer readable medium (e.g., a disc) which stores code for implementing any embodiment of the inventive method.

DETAILED DESCRIPTION OF THE PREFERRED EMBODIMENTS

Many embodiments of the present invention are technologically possible. It will be apparent to those of ordinary skill in the art from the present disclosure how to implement them. Embodiments of the inventive system, method, and medium will be described with reference to FIGS. 2 and 3.

In a class of embodiments, the invention is a method for applying reverb to an M-channel downmixed audio input signal indicative of X individual audio channels, where X is a number greater than M, and a system configured to perform the method. In these embodiments the method includes the steps of:

(a) in response to spatial cue parameters indicative (e.g., descriptive) of the spatial image of the downmixed input signal, generating Y discrete reverb channel signals (e.g., in the quadrature mirror filter or "QMF" domain), where each of the reverb channel signals at a time, t, is a linear combination of at least a subset of values of the X individual audio channels at the time, t; and (b) individually applying reverb to each of at least two of the reverb channel signals (e.g., in the QMF domain), thereby generating Y reverbed channel signals. Preferably, the reverb applied to at least one of the reverb channel signals has a different reverb impulse response than does the reverb applied to at least one other one of the reverb channel signals. In some embodiments, X=Y, but in other embodiments X is not equal to Y. In some embodiments, Y is greater than M, and the input signal is upmixed in step (a) in response to the spatial cue parameters to generate the Y reverb channel signals. In other embodiments, Y is equal to M or Y is less than M.

Figure 1:
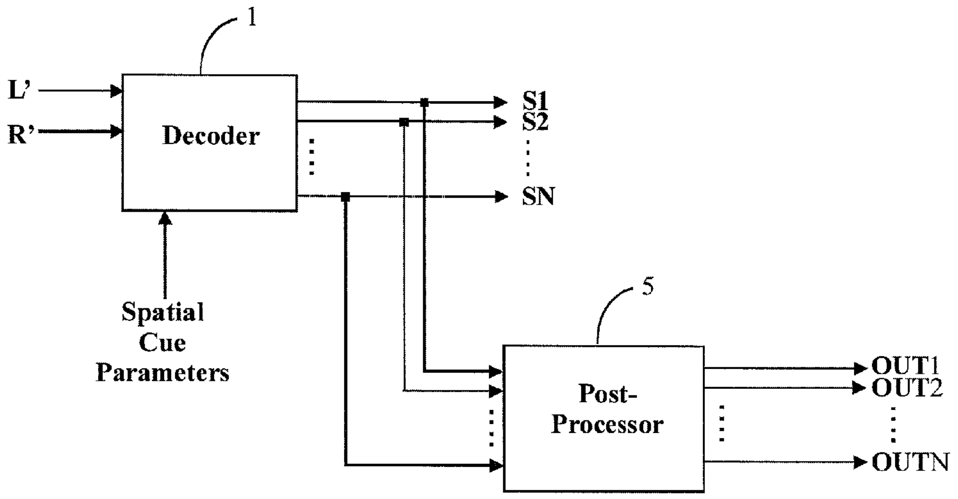
FIG. 1 is a block diagram of a conventional MPEG Surround decoder system.
Figure 2:
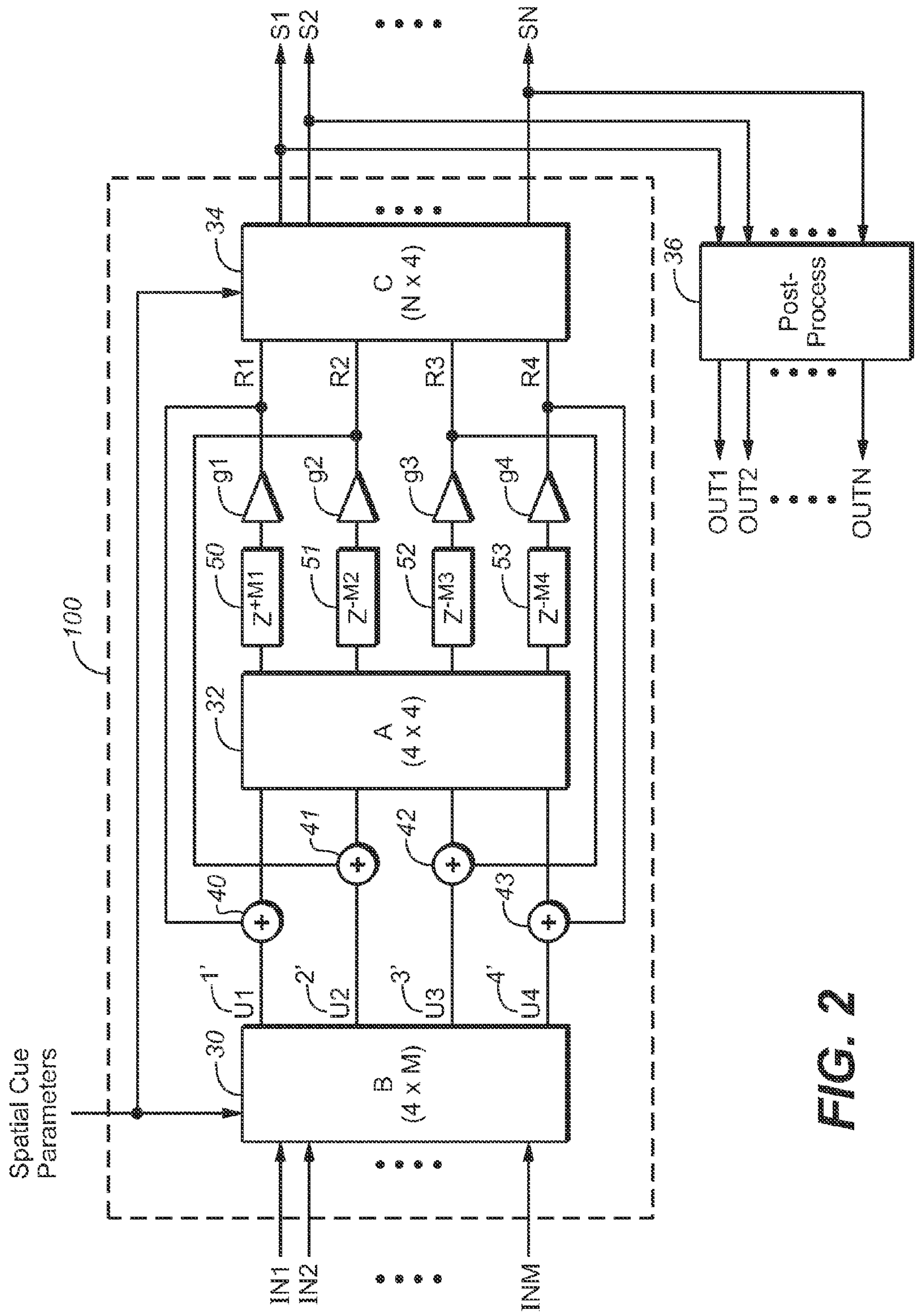
FIG. 2 is a block diagram of a multiple input, multiple output, FDN-based reverberator (100) that can be implemented in accordance with an embodiment of the present invention.

FIG. 2 is a block diagram of multiple input, multiple output, FDN-based reverberator 100 which can be implemented in a manner to be explained below to perform this method. Reverberator 100 of FIG. 2 includes:

pre-mix matrix 30 (matrix "B"), which is a 4×M matrix coupled and configured to receive and generate four discrete reverb channel signals U1, U2, U3, and U4 (corresponding to the feeding branches 1', 2', 3', 4', respectively) in response to an M-channel downmixed audio input signal, comprising channels IN1, IN2, . . . , and INM, which is indicative of five (X=5) individual upmix audio channels. Each of the reverb channel signals at a time, t, is a linear combination of a subset of values of the X individual upmix audio channels at the time, t. In the case that M is less than four, matrix B upmixes the input signal to generate the reverb channel signals. In a typical embodiment, M is equal to 2. Matrix 30 is coupled also to receive spatial cue parameters which are indicative (e.g., descriptive) of the spatial image of the M-channel downmixed input signal, and is configured to generate four (Y=4) discrete upmix channel signals, i.e. the discrete reverb channel signals U1, U2, U3, and U4, in response to the spatial cue parameters;

addition elements 40, 41, 42, and 43, coupled to the outputs of matrix 30, to which reverb channel signals U1, U2, U3, and U4 are asserted. Element 40 is configured to add the output of gain element g1 (i.e., apply feedback from the output of gain element g1) to reverb channel signal U1. Element 41 is configured to add the output of gain element g2 to reverb channel signal U2. Element 42 is configured to add output of gain element g3 to reverb channel signal U3. Element 43 is configured to add the output of gain element g4 to reverb channel signal U4;

scattering matrix 32 (matrix "A"), which is coupled to receive the outputs of addition elements 40, 41, 42, and 43. Matrix 32 is preferably a 4×4 unitary matrix configured to assert a filtered version of the output of each of addition elements 40, 41, 42, and 43 to a corresponding one of delay lines, $z^{-M_k}$, where 0≤k−1≤3, and is preferably a fully populated matrix in order to provide maximum diffuseness. Delay lines $z^{-M1}$, $z^{-M2}$, $z^{-M3}$, and $z^{-M4}$, are labeled respectively as delay lines 50, 51, 52, and 53 in FIG. 2;

gain elements, gk, where 0≤k−1≤3, which apply gain the outputs of delay lines, $z^{-M_k}$, thus providing damping factors for controlling the decay time of the reverb applied in each upmix channel. Each gain element, gk, is typically combined with a low-pass filter. In some embodiments, the gain elements apply different, predetermined gain factors for the different QMF bands. Reverbed channel signals R1, R2, R3, and R4, respectively, are asserted at the outputs of gain elements g1, g2, g3, and g4; and post-mix matrix 34 (matrix "C"), which is an N×4 matrix coupled and configured to down mix and/or upmix (and optionally to perform other filtering on) the reverbed channel signals R1, R2, R3, and R4 asserted at the outputs of gain elements gk, in response to at least a subset (e.g., all or some) of the spatial cue parameters asserted to matrix 30, thereby generating an N-channel, QMF domain, downmixed, reverbed audio output signal comprising channels S1, S2, . . . , and SN. In variations on the FIG. 2 embodiment, matrix 34 is a constant matrix whose coefficients do not vary with time in response to any spatial cue parameter.

In variations on the FIG. 2 embodiment, the inventive system has Y reverb channels (where Y is less than or greater than four), pre-mix matrix 30 is configured to generate Y discrete reverb channel signals in response to the down mixed, M-channel, input signal and the spatial cue parameters, scattering matrix 32 is replaced by an Y×Y matrix, and the inventive system has Y delay lines, $z^{-M_k}$.

For example, in one case in which Y=M=2, the downmixed input signal is indicative of five upmix channels (X=5): left front, right front, center front, left surround, and right surround channels. In accordance with the invention, in response to spatial cue parameters indicative of the spatial image of the downmixed input signal, a pre-mix matrix (a variation on matrix 30 of FIG. 2) generates two discrete reverb channel signals (e.g., in the quadrature mirror filter or "QMF" domain): one a mix of the front channels; the other a mix of the surround channels. Reverb having a short decay response is generated from (and applied to) one reverb channel signal and reverb having a long decay response is generated from (and applied to) the other reverb channel signal (e.g., to simulate a room with "live end/dead end" acoustics).

With reference again to FIG. 2, post-processor 36 optionally is coupled to the outputs of matrix 34 and operable to perform post-processing on the downmixed, reverbed output S1, S2, . . . , SN of matrix 34, to generate an N-channel post-processed audio output signal comprising channels OUT1, OUT2, . . . , and OUTN. Typically, N=2, so that the FIG. 2 system outputs a binaural, downmixed, reverbed audio signal S1, S2 and/or a binaural, post-processed, downmixed, reverbed audio output signal OUT, OUT2.

For example, the output of matrix 34 of some implementations of the FIG. 2 system is a binaural, virtual surround sound signal, which when reproduced by headphones, is perceived by the listener as sound emitting from left ("L"), center ("C"), and right ("R") front sources (e.g., left, center, and right physical speakers positioned in front of the listener), and left-surround ("LS") and right-surround ("RS") rear sources (e.g., left, and right physical speakers positioned behind the listener).

In some variations on the FIG. 2 system, post-mix matrix 34 is omitted and the inventive reverberator outputs Y-channel reverbed audio (e.g., upmixed, reverbed audio) in response to an M-channel downmixed audio input. In other variations, matrix 34 is an identity matrix. In other variations, the system has Y upmix channels (where Y is a number greater than four) and matrix 34 is an N×Y matrix (e.g., Y=7).

Although the FIG. 2 system has four reverb channels and four delay lines, $z^{-M_k}$, variations on the system (and other embodiments of the inventive reverberator) implement more than or less than four reverb channels. Typically, the inventive reverberator includes one delay line per reverb channel.

In implementations of the FIG. 2 system in which the input signal is an M-channel, MPEG Surround ("MPS") downmixed signal, the input signal asserted to the inputs of matrix 30 comprises QMF domain signals IN1($t,f$), IN2($t,f$), . . . , and INM(t,f), and the FIG. 2 system performs processing (e.g., in matrix 30) and reverb application thereon in the QMF domain. In such implementations, the spatial cue parameters asserted to matrix 30 are typically Channel Level Difference (CLD) parameters and/or Channel Prediction Coefficient (CPC) parameters, and/or Inter-channel Cross Correlation (ICC) parameters, of the type comprising part of a conventional MPS bitstream.

In order to provide such QMF domain inputs to matrix 30 in response to a time-domain, M-channel MPS downmixed signal, the inventive method would include a preliminary step of transforming this time-domain signal into the QMF domain to generate QMF domain frequency components, and would perform above-described steps (a) and (b) in the QMF domain on these frequency components.

Figure 3:
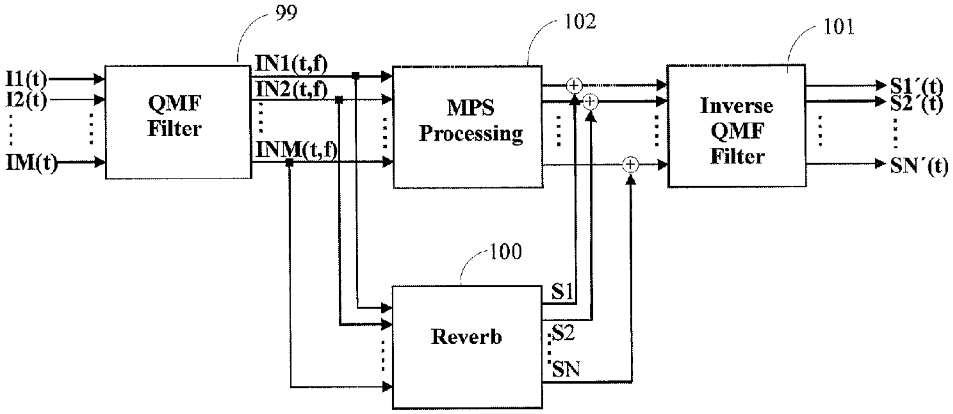
FIG. 3 is a block diagram of a reverberator system including reverberator 100 of FIG. 2, conventional MPS processor 102, time domain-to-QMF domain transform filter 99 for transforming a multi-channel input into the QMF domain for processing in reverberator 100 and processor 102, and QMF domain-to-time domain transform filter 101 for transforming the combined output of reverberator 100 and processor 102 into the time domain.

For example, because the input to the FIG. 3 system is a time-domain MPS downmixed audio signal comprising M channels I1($t$), I2($t$), . . . , and IM(t), the FIG. 3 system includes filter 99 for transforming this time-domain signal into the QMF domain. Specifically, the FIG. 3 system includes reverberator 100 (corresponding to and possibly identical to reverberator 100 of FIG. 2), conventional MPS processor 102, time domain-to-QMF domain transform filter 99 coupled and configured to transform each of the time-domain input channels I1($t$), I2($t$), . . . , and IM(t) into the QMF domain (i.e., into a sequence of QMF domain frequency components) for processing in reverberator 100 and conventional processing in processor 102. The FIG. 3 system also includes QMF domain-to-time domain transform filter 101, which is coupled and configured to transform the N-channel combined output of reverberator 100 and processor 102 into the time domain.

Specifically, filter 99 transforms time-domain signals I1($t$), I2($t$), . . . , and IM(t) respectively into QMF domain signals IN1($t,f$), IN2($t,f$), . . . , and INM(t,f), which are asserted to reverberator 100 and processor 102. Each of the N channels output from processor 102 is combined (in an adder) with the corresponding reverbed channel output of reverberator 100 (S1, S2, . . . , or SN indicated in FIG. 2, or one of OUT1, OUT2, . . . , or OUTN indicated in FIG. 2 if reverberator 100 of FIG. 3 also includes a post-processor 36 as shown in FIG. 2). Filter 101 of FIG. 3 transforms the combined (reverbed) output of reverberator 100 and processor 102 (N sequences of QMF domain frequency components S1'($t, f$), S2'($t,f$), . . . , SN'(t, f)) into time-domain signals S1'($t$), S2'($t$), . . . , SN'(t).

In typical embodiments of the invention, the input downmixed signal is a 2-channel downmixed MPS signal indicative of five individual audio channels (left-front, right-front, center, left-surround, and right surround channels), and reverb determined by a different reverb impulse response is applied to each of these five channels, resulting in improved surround sound quality.

If the coefficients of pre-mix matrix 30 (Y×M matrix B, which is a 4×2 matrix in the case that Y=4 and M=2) were constant coefficients (not time-varying coefficients determined in response to spatial cue parameters) and the coefficients of post-mix matrix 34 (N×Y matrix C, which is a 2×4 matrix in the case that Y=4 and N=2) were constant coefficients, the FIG. 2 system could not produce and apply individual reverb with individual impulse responses for different channels in the down mix determined by the M-channel, downmixed, MPS encoded, input to the reverberator (e.g., in response to a QMF-domain, MPS-encoded, M-channel downmixed signal IN1($t, f$), IN2($t, f$), . . . , INM(t, f)). Consider an example in which M=2, Y=4, and N=2, and matrices B and C of FIG. 2 (also labeled as matrices 30 and 34 in FIG. 2) were replaced respectively by constant 4×2 and 2×4 matrices with the following constant coefficients:

$$B=\begin{pmatrix}0.707 & 0\\ 0 & 0.707\\ 0.707 & 0\\ 0 & 0.707\end{pmatrix},\text{ and } C=\begin{pmatrix}0.707 & 0\\ 0 & 0.707\\ 0.707 & 0\\ 0 & 0.707\end{pmatrix}^T. \quad \text{(Eq. 1)}$$

In this example, the coefficients of the constant matrices B and C would not change as a function of time in response to spatial cue parameters indicative of the downmixed input audio, and the so-modified FIG. 2 system would operate in a conventional stereo-to-stereo reverb mode. In such conventional reverb mode, reverb having the same reverb impulse response would be applied to each individual channel in the downmix (i.e., left-front channel content in the downmix would receive reverb having the same impulse response as would right-front channel content in the downmix).

However, by applying the reverb process in the QMF domain in response to Channel Level Difference (CLD) parameters, Channel Prediction Coefficient (CPC), and/or Inter-channel Cross Correlation (ICC) parameters available as part of the MPS bitstream (and/or in response to other spatial cue parameters) in accordance with the invention, the FIG. 2 system can produce and apply reverb to each reverb channel determined by the downmixed input to the system, with individual reverb impulse responses for each of the reverb channels. In a typical application, less reverb is applied in accordance with the invention to a center channel (for clearer speech/dialog) than to at least one other reverb channel so that the impulse response of the reverb applied each of these reverb channels is different. In such application (and other applications), the impulse responses of the reverb applied to different reverb channels are not based on different channel routing to matrix 30 and are instead simply different scale factors applied by pre-mix matrix 30 or post-mix matrix 34 (and/or at least one other system element) to different reverb channels.

For example, in an implementation of the FIG. 2 system configured to apply reverb to a QMF-domain, MPS encoded, stereo downmix of five upmix channels, matrix 30 is a 4×2 matrix having time-varying coefficients which depend on current values of coefficients, wij, where i ranges from 1 to 3 and j ranges from 1 to 2.

In this exemplary implementation, M=2, X=5, and Y=4, the input signal is a sequence of QMF domain value pairs, IN1($t,f$)=L(t), and IN2($t,f$)=R(t), indicative of a sequence of values of five individual channel signals, $L_{front}$, $R_{front}$, C, $L_{sur}$, and $R_{sur}$. Each of the five individual channel signals is a sequence of values $$(L_{front}\ R_{front}\ C\ L_{surr}\ R_{surr})^T = W\begin{pmatrix} L \\ R \end{pmatrix},$$

where W is an MPEG Surround upmix matrix of form $$W = \begin{pmatrix} g_{lf}w_{11} & g_{lf}w_{12} \\ g_{rf}w_{21} & g_{rf}w_{22} \\ w_{31} & w_{32} \\ g_{ls}w_{11} & g_{ls}w_{12} \\ g_{rs}w_{21} & g_{rs}w_{22} \end{pmatrix}.$$

In this example, the coefficients wij, would be updated in response to the current values of conventional CPC parameters CPC_1 and CPC_2 and conventional ICC parameter ICC_TTT (the Inter-channel Cross Correlation parameter for the Two-To-Three, or "TTT," upmixer assumed during encoding of the downmixed input signal):

$$w11=(CPC\_1+2)/(3*ICC\_TTT);$$

$$w12=(CPC\_2-1)/(3*ICC\_TTT);$$

$$w21=(CPC\_1-1)/(3*ICC\_TTT);$$

$$w22=(CPC\_2+2)/(3*ICC\_TTT);$$

$$w31=(1-CPC\_1)/(3*ICC\_TTT);\text{ and}$$

$$w32=(1-CPC\_2)/(3*ICC\_TTT). \quad \text{(Eq. 1a)}$$

Also using the conventional CLD parameters for the left front/surround channels ($CLD_{lf\_ls}$) and the right front/surround channels ($CLD_{rf\_rs}$), the time-varying coefficients of matrix 30 would depend also on the following four, time-varying channel gain values, in which $CLD_{lf\_ls}$ is the current value of the left front/surround CLD parameter, and $CLD_{rf\_rs}$ is the current value of the right front/surround CLD parameter:

$$g_{lf} = \frac{10^{CLD_{lf\_ls}/20}}{1+10^{CLD_{lf\_ls}/20}} \quad \text{(Eq. 2)}$$

$$g_{ls} = \frac{1}{1+10^{CLD_{lf\_ls}/20}}$$

$$g_{rf} = \frac{10^{CLD_{rf\_rs}/20}}{1+10^{CLD_{rf\_rs}/20}}$$

$$g_{rs} = \frac{1}{1+10^{CLD_{rf\_rs}/20}}$$

The time-varying coefficients of matrix 30 would be:

$$B = \begin{pmatrix} g_{lf}w_{11} & g_{lf}w_{12} \\ g_{rf}w_{21} & g_{rf}w_{22} \\ g_{ls}w_{11} & g_{ls}w_{12} \\ g_{rs}w_{21}+w_{31} & g_{rs}w_{22}+w_{32} \end{pmatrix} \quad \text{(Eq. 3)}$$

Thus, in the exemplary implementation, the four reverb channel signals output from matrix 30 are U1=$(g_{lf}w_{11})L+(g_{lf}w_{12})R$, U2=$(g_{rf}w_{21})L+(g_{rf}w_{22})R$, U3=$(g_{ls}w_{11})L+(g_{ls}w_{12})R$, and U4=$(g_{rs}w_{21}+w_{31})L+(g_{rs}w_{22}+w_{32})R$. Thus, the matrix multiplication performed by matrix 30 (having the coefficients shown in Equation 3) can be represented as:

$$B\begin{pmatrix} L \\ R \end{pmatrix} = B_0W\begin{pmatrix} L \\ R \end{pmatrix} = \begin{pmatrix} g_{lf}w_{11} & g_{lf}w_{12} \\ g_{rf}w_{21} & g_{rf}w_{22} \\ g_{ls}w_{11} & g_{ls}w_{12} \\ g_{rs}w_{21}+w_{31} & g_{rs}w_{22}+w_{32} \end{pmatrix}\begin{pmatrix} L \\ R \end{pmatrix},\text{ where}$$

$$B_0 = \begin{pmatrix} 1 & 0 & 0 & 0 & 0 \\ 0 & 1 & 0 & 0 & 0 \\ 0 & 0 & 0 & 1 & 0 \\ 0 & 0 & 1 & 0 & 1 \end{pmatrix}.$$

This matrix multiplication is equivalent to an upmix to five individual channel signals (by the MPEG Surround upmix matrix W defined above) followed by a downmix of these five signals to the four reverb channel signals by matrix $B_0$.

In a variation on the implementation of matrix 30 having the coefficients shown in Equation 3, matrix 30 is implemented with the following coefficients:

$$B = B_0W = \begin{pmatrix} K_{LF}g_{lf}w_{11}+K_{LS}g_{ls}w_{11} & K_{LF}g_{lf}w_{12}+K_{LS}g_{ls}w_{12} \\ K_{RF}g_{rf}w_{21}+K_{RS}g_{rs}w_{21} & K_{RF}g_{rf}w_{22}+K_{RS}g_{rs}w_{22} \\ K_Cw_{31} & K_Cw_{32} \\ K_Cw_{31} & K_Cw_{32} \end{pmatrix}, \quad \text{(Eq. 4)}$$

where $K_{LF}$, $K_{RF}$, $K_C$, $K_{LS}$ and $K_{RS}$ are fixed reverb gain values for the different channels, and $g_{lf}$, $g_{ls}$, $g_{rf}$, $g_{lf}$, and $w_{11}$ to $w_{32}$ are as in Equation 2 and 1a, respectively. Typically, the four fixed reverb gain values are substantially equal to each other, except that $K_C$ typically has a slightly lower value than the others (a few decibels lower than the values of the others) in order to apply less reverb to the center channel (e.g., for dryer sounding speech/dialog).

Matrix 30, implemented with the coefficients of Equation 4, is equivalent to the product of the MPEG Surround upmix matrix W defined above and the following downmix matrix $B_0$:

$$B = B_0W = \begin{pmatrix} K_{LF}g_{lf}w_{11}+K_{LS}g_{ls}w_{11} & K_{LF}g_{lf}w_{12}+K_{LS}g_{ls}w_{12} \\ K_{RF}g_{rf}w_{21}+K_{RS}g_{rs}w_{21} & K_{RF}g_{rf}w_{22}+K_{RS}g_{rs}w_{22} \\ K_Cw_{31} & K_Cw_{32} \\ K_Cw_{31} & K_Cw_{32} \end{pmatrix},$$

where $$B_0 = \begin{pmatrix} K_{LF} & 0 & 0 & K_{LS} & 0 \\ 0 & K_{RF} & 0 & 0 & K_{RS} \\ 0 & 0 & K_C & 0 & 0 \\ 0 & 0 & K_C & 0 & 0 \end{pmatrix}.$$

In the case that matrix 30 is implemented with the coefficients of Equation 3 (or Equation 4), matrix 34 would typically be a constant matrix. Alternatively, matrix 34 would have time-varying coefficients, e.g., in one implementation its coefficients would be $C=B^T$, where $B^T$ is the transpose of matrix 30. Matrix 30 with the coefficients set forth in Equation 3, and matrix 34 (if implemented as the transpose of such matrix), would have the same general form as the constant mix matrices B and C of Equation 1, but with variable coefficients determined by the variable gain values of Equation 2 and above-described variable coefficient values, wij, of Equation 1a substituted for the constant elements.

Implementing matrix 30 with the variable coefficients of Equation 3 would cause reverb channels U1, U2, U3, and U4, respectively, to be the left-front upmix channel (feeding branch 1' of the FIG. 2 system), the right-front upmix channel (feeding branch 2' of the FIG. 2 system), the left-surround upmix channel (feeding branch 3' of the FIG. 2 system), and a combined right-surround and center upmix channel (the right-surround channel plus the center channel) feeding branch 4' of the FIG. 2 system. Hence, the reverb individually applied to the four branches of the FIG. 2 system would have individually determined impulse responses.

Alternatively, matrix 30's coefficients are determined in another manner in response to available spatial cue parameters. For example, in some embodiments matrix 30's coefficients are determined in response to available MPS spatial cue parameters to cause matrix 30 to implement a TTT upmixer operating in a mode other than in a prediction mode (e.g., an energy mode with or without center subtraction). This can be done in a manner that will be apparent to those of ordinary skill in the art given the present description, using the well known upmixing formulas for the relevant cases that are described in the MPEG standard (ISO/IEC 23003-1: 2007).

In an implementation of the FIG. 2 system configured to apply reverb to a QMF-domain, MPS encoded, single-channel (monaural) downmix of four upmix channels, matrix 30 is a 4×1 matrix having time-varying coefficients:

$$B = \begin{pmatrix} g_{lf} \\ g_{rf} \\ g_{ls} \\ g_{rs} \end{pmatrix},$$

where the coefficients are gain factors are derived from the CLD parameters $CLD_{lf\_ls}$, $CLD_{rf\_rs}$, $CLD_{c\_lr}$ and $CLD_{l\_r}$, available as part of a conventional MPS bitstream.

In variations on the FIG. 2 system and other embodiments of the inventive reverberator, discrete reverb channels (e.g., upmix channels) are extracted from a downmixed input signal and routed to individual reverb delay branches in any of many different ways. In various embodiments of the inventive reverberator, other spatial cue parameters are employed to upmix a downmixed input signal (e.g., including by control channel weighting). For example, in some embodiments, ICC parameters (available as part of a conventional MPS bitstream) that describe front-back diffuseness are used to determine coefficients of the pre-mix matrix and thereby to control reverb level.

Preferably, the inventive method also includes a step of applying to the reverbed channel signals corresponding head-related transfer functions (HRTFs), by filtering the reverbed channel signals in an HRTF filter. For example, matrix 34 of the FIG. 2 system is preferably implemented as the HRTF filter which applies such HRTFs to, and also performs the above-described downmixing operation on, reverbed channels R1, R2, R3, and R4. Such implementation of matrix 34 would typically perform the same filtering as a 5×4 matrix followed by a 2×5 matrix, where the 5×4 matrix generates five virtual reverbed channel signals (left-front, right-front, center, left-surround and right surround channels) in response to the four reverbed channel signals R1-R4 output from gain elements g1, g2, g3, and g4, and the 2×5 matrix applies an appropriate HRTF to each such virtual reverbed channel signal, and downmixes the resulting five channel signals to generate a 2-channel downmixed reverbed output signal. Typically however, matrix 34 would be implemented as a single 2×4 matrix that performs the described functions of the separate 5×4 and 2×5 matrices. The HRTFs are applied to make the listener perceive the reverb applied in accordance with the invention as more natural sounding. The HTRF filter would typically perform for each individual QMF band a matrix multiplication by a matrix with complex valued entries.

In some embodiments, reverbed channel signals generated from a QMF-domain, MPS encoded, downmixed input signal are filtered with corresponding HRTFs as follows. In these embodiments, the HRTFs in the parametric QMF domain essentially consist of left and right gain parameter values and Inter-channel Phase Difference (IPD) parameter values that characterize the downmixed input signal. The IPDs optionally are ignored to reduce complexity. Assuming that the IPDs are ignored, the HRTFs are constant gain values (four gain values for each of the left and the right channel, respectively): $g_{HRIF\_lf\_L}$, $g_{HRIF\_rf\_L}$, $g_{HRIF\_ls\_L}$, $g_{HRIF\_rs\_L}$, $g_{HRIF\_lf\_R}$, $g_{HRIF\_rf\_R}$, $g_{HRIF\_ls\_R}$, $g_{HRIF\_rs\_R}$. The HRTFs can thus be applied to the reverbed channel signals R1, R2, R3, and R4 of FIG. 2 by an implementation of post-mix matrix 34 having the following coefficients:

$$C = \begin{pmatrix} g_{HRIF\_lf\_L} & g_{HRIF\_lf\_R} \\ g_{HRIF\_rf\_L} & g_{HRIF\_rf\_R} \\ g_{HRIF\_ls\_L} & g_{HRIF\_ls\_R} \\ g_{HRIF\_rs\_L} & g_{HRIF\_rs\_R} \end{pmatrix}^T$$

In preferred implementations of the inventive reverberator (which may be implemented, for example, as variations on the FIG. 2 system), fractional delay is applied in at least one reverb channel, and/or reverb is generated and applied differently to different frequency bands of frequency components of audio data in at least one reverb channel.

Some such preferred implementations of the inventive reverberator are variations on the FIG. 2 system that are configured to apply fractional delay (in at least one reverb channel) as well as integer sample delay. For example, in one such implementation a fractional delay element is connected in each reverb channel in series with a delay line that applies integer delay equal to an integer number of sample periods (e.g., each fractional delay element is positioned after or otherwise in series with one of delay lines 50, 51, 52, and 53 of FIG. 2). Fractional delay can be approximated by a phase shift (unity complex multiplication) in each QMF band that corresponds to a fraction of the sample period: f=T/T, where f is the delay fraction, r is the desired delay for the QMF band, and T is the sample period for the QMF band. It is well known how to apply fractional delay in the context of applying reverb in the QMF domain (see for example, J. Engdegard, et al., "Synthetic Ambience in Parametric Stereo Coding," presented at the 116$^{th}$ Convention of the Audio Engineering Society, in Berlin, Germany, May 8-11, 2004, 12 pages, and U.S. Pat. No. 7,487,097, issued Feb. 3, 2009 to J. Engdegard, et al.).

Some of the above-noted preferred implementations of the inventive reverberator are variations on the FIG. 2 system that are configured to apply reverb differently to different frequency bands of the audio data in at least one reverb channel, in order to reduce complexity of the reverberator implementation. For example, in some implementations in which the audio input data, IN1-INM, are QMF domain MPS data, and the reverb application is performed in the QMF domain, the reverb is applied differently to the following four frequency bands of the audio data in each reverb channel:

0 kHz-3 kHz (or 0 kHz-2.4 kHz): reverb is applied in this band as in the above-described embodiment of FIG. 2, with matrix 30 implemented with the coefficients of Equation 4);

3 kHz-8 kHz (or 2.4 kHz-8 kHz): reverb is applied in this band with real valued arithmetic only. For example, this can be done using the real valued arithmetic techniques described in International Application Publication No. WO 2007/031171 A1, published Mar. 22, 2007. This reference describes a 64 band QMF filterbank in which complex values of the eight lowest frequency bands are audio data are processed and only real values of the upper 56 frequency bands of the audio data are processed. One of such eight lowest frequency bands can be used as a complex QMF buffer band, so that complex-valued arithmetic calculations are performed for only seven of the eight lowest QMF frequency bands (so that reverb is applied in this relatively low frequency range as in the above-described embodiment of FIG. 2, with matrix 30 implemented with the coefficients of Equation 4), and real-valued arithmetic calculations are performed for the other 56 QMF frequency bands, with the crossover between complex valued and real valued calculations occurring at the frequency (7×44.1 kHz)/(64×2) which is approximately equal to 2.4 kHz. In this exemplary embodiment, reverb is applied in the relatively high frequency range as in the above-described FIG. 2 embodiment but using a simpler implementation of pre-mix matrix 30 to perform real-valued computations only. Reverb is applied in the relatively low frequency range (below 2.4 kHz) as in the FIG. 2 embodiment, e.g., with matrix 30 implemented with the coefficients of Equation 4);

8 kHz-15 kHz: reverb is applied in this band by a simple delay technique. For example, reverb is applied in a way similar to the manner it is applied the above-described FIG. 2 embodiment but with only two reverb channels with a delay line and low-pass filter in each reverb channel, with matrix elements 32 and 34 omitted, with a simple, 2×2 implementation of pre-mix matrix 30 (e.g., to apply less reverb to the center channel than to each other channel), and without feedback from nodes along the reverb channels to the outputs of the pre-mix matrix. The two delay branches can be simply fed to left and right outputs, respectively, or can be switched so that echoes from the left front (Lf) and left surround (Ls) channels end up in the right output channel and echoes from the right front (Rf) and right surround (Rs) channels end up in the left output channel The 2×2 pre-mix matrix can have the following coefficients:

$$B = \begin{pmatrix} K_{LF} g_{lf} w_{11} + K_{LS} g_{ls} + K_C w_{31} & K_{LF} g_{lf} w_{12} + K_{LS} g_{ls} w_{12} + K_C w_{32} \\ K_{RF} g_{rf} w_{21} + K_{RS} g_{rs} w_{21} + K_C w_{31} & K_{RF} g_{rf} w_{22} + K_{RS} g_{rs} w_{22} + K_C w_{32} \end{pmatrix},$$

where the symbols are defined as in Equation 4 above; and 15-22.05 kHz: no reverb is applied in this band.

In variations on the embodiments disclosed herein (e.g., the FIG. 2 embodiment, the inventive system applies reverb to an M-channel downmixed audio input signal indicative of X individual audio channels, where X is a number greater than M, including by generating Y discrete reverb channel signals in response to the downmixed signal but not in response to spatial cue parameters. In these variations, the system individually applies reverb to each of at least two of the reverb channel signals in response to spatial cue parameters indicative of spatial image of the downmixed input signal, thereby generating Y reverbed channel signals. For example, in some such variations the coefficients of a pre-mix matrix (e.g., a variation on matrix 30 of FIG. 2) are not determined in response to spatial cue parameters, but at least one of a scattering matrix (e.g., a variation on matrix 32 of FIG. 2), a gain stage (e.g., a variation on the gain stage comprising elements g1-*gk* of FIG. 2), and a post-mix matrix (e.g., a variation on matrix 34 of FIG. 2) operates on the reverb channel signals in a manner determined by spatial cue parameters indicative of spatial image of the downmixed input signal, to apply reverb to each of at least two of the reverb channel signals.

In some embodiments, the inventive reverberator is or includes a general purpose processor coupled to receive or to generate input data indicative of an M-channel downmixed audio input signal, and programmed with software (or firmware) and/or otherwise configured (e.g., in response to control data) to perform any of a variety of operations on the input data, including an embodiment of the inventive method. Such a general purpose processor would typically be coupled to an input device (e.g., a mouse and/or a keyboard), a memory, and a display device. For example, the FIG. 3 system could be implemented in a general purpose processor, with inputs I1(*t*), I2(*t*), . . . , IM(t), being input data indicative of M channels of downmixed audio data, and outputs S1(*t*), S2(*t*), . . . , SN(t), being output data indicative of N channels of downmixed, reverbed audio. A conventional digital-to-analog converter (DAC) could operate on this output data to generate analog versions of the output audio signals for reproduction by speakers (e.g., a pair of headphones).

While specific embodiments of the present invention and applications of the invention have been described herein, it will be apparent to those of ordinary skill in the art that many variations on the embodiments and applications described herein are possible without departing from the scope of the invention described and claimed herein. It should be understood that while certain forms of the invention have been shown and described, the invention is not to be limited to the specific embodiments described and shown or the specific methods described.

What is claimed is:

1. A method for applying reverb to an M-channel downmixed audio input signal indicative of X individual audio channels, where X is a number greater than M, said method including the steps of:

(a) in response to spatial cue parameters indicative of a spatial image of the downmixed input signal, generating Y discrete reverb channel signals from the M-channel downmixed audio input signal; wherein each of the reverb channel signals at a time, t, is a linear combination of at least a subset of values of the X individual audio channels at the time, t; wherein the Y discrete reverb channel signals are generated using a pre-mix matrix comprising time-varying coefficients determined in response to the spatial cue parameters; and (b) individually applying reverb to each of the reverb channel signals, thereby generating Y reverbed channel signals, wherein reverb is applied individually to each of the reverb channel signals by feeding back to each of the reverb channel signals a delayed version of the corresponding reverb channel signal, and the reverb applied to at least one of the reverb channel signals has a different reverb impulse response than does the reverb applied to at least one other one of the reverb channel signals.

2. The method of claim 1, wherein the input signal is an M-channel, MPEG Surround downmixed signal, and the spatial cue parameters include at least one of Channel Level Difference parameters, Channel Prediction Coefficient parameters, and Inter-channel Cross Correlation parameters.

3. The method of claim 2, wherein the spatial cue parameters include Channel Level Difference parameters, Channel Prediction Coefficient parameters, and Inter-channel Cross Correlation parameters.

4. The method of claim 1, wherein the input signal is a QMF-domain, MPEG Surround downmixed signal comprising M sequences of QMF domain frequency components, and wherein each of steps (a) and (b) is performed in the QMF domain.

5. The method of claim 4, wherein the spatial cue parameters include at least some of Channel Level Difference parameters, Channel Prediction Coefficient parameters, and Inter-channel Cross Correlation parameters.

6. The method of claim 4, wherein the spatial cue parameters include Channel Level Difference parameters, Channel Prediction Coefficient parameters, and Inter-channel Cross Correlation parameters.

7. The method of claim 1, wherein the input signal is a time-domain, MPEG Surround downmixed signal, and also including the step of:

before step (a), transforming the time-domain, MPEG Surround downmixed signal into the QMF domain thereby generating M sequences of QMF domain frequency components, and wherein each of steps (a) and (b) is performed in the QMF domain.

8. The method of claim 1, also including the step of downmixing the Y reverbed channel signals, thereby generating an N-channel, downmixed, reverbed audio signal, where N is a number less than Y.

9. The method of claim 8, wherein the downmixing is performed in response to at least a subset of the spatial cue parameters using a post-mix matrix comprising time-varying coefficients determined in response to the spatial cue parameters.

10. The method of claim 1, also including the step of applying to the reverbed channel signals corresponding head-related transfer functions by filtering the reverbed channel signals in a head-related transfer function filter.

11. The method of claim 1, wherein Y is greater than M.

12. The method of claim 1, also including the step of downmixing the reverbed channel signals and applying to said reverbed channel signals corresponding head-related transfer functions.

13. A reverberator configured to apply reverb to an M-channel downmixed audio input signal indicative of X individual audio channels, where X is a number greater than M, said reverberator including:

a first subsystem, coupled to receive the input signal and spatial cue parameters indicative of a spatial image of said input signal, and configured to generate Y discrete reverb channel signals in response to the input signal, including by applying a pre-mix matrix comprising time-varying coefficients determined in response to the spatial cue parameters, such that each of the reverb channel signals at a time, t, is a linear combination of at least a subset of values of the X individual audio channels at the time, t; and a reverb application subsystem coupled to the first subsystem and configured to apply reverb individually to each of the reverb channel signals, thereby generating a set of Y reverbed channel signals; wherein the reverb application subsystem is a feedback delay network including Y branches, each of the branches configured to apply reverb individually to a different one of the reverb channel signals, wherein the reverb application subsystem is configured to apply the reverb such that the reverb applied to at least one of the reverb channel signals has a different reverb impulse response than does the reverb applied to at least one other one of the reverb channel signals.

14. The reverberator of claim 13, wherein the input signal is an M-channel, MPEG Surround downmixed signal, and the spatial cue parameters include at least some of Channel Level Difference parameters, Channel Prediction Coefficient parameters, and Inter-channel Cross Correlation parameters.

15. The reverberator of claim 13, wherein the spatial cue parameters include Channel Level Difference parameters, Channel Prediction Coefficient parameters, and Inter-channel Cross Correlation parameters.

16. The reverberator of claim 13, wherein the input signal is a QMF-domain, MPEG Surround downmixed signal comprising M sequences of QMF domain frequency components, and the spatial cue parameters include at least some of Channel Level Difference parameters, Channel Prediction Coefficient parameters, and Inter-channel Cross Correlation parameters.

17. The reverberator of claim 16, wherein the spatial cue parameters include Channel Level Difference parameters, Channel Prediction Coefficient parameters, and Inter-channel Cross Correlation parameters.

18. The reverberator of claim 13, wherein the downmixed audio input signal is a set of M sequences of QMF domain frequency components, said reverberator also including:

a time domain-to-QMF domain transform filter coupled to receive a time-domain, MPEG Surround downmixed signal and configured to generate in response thereto the M sequences of QMF domain frequency components, and wherein the upmix subsystem is coupled and configured to upmix said M sequences of QMF domain frequency components in the QMF domain.

19. The reverberator of claim 13, also including a post-mix subsystem coupled and configured to downmix the reverbed channel signals, thereby generating an N-channel, downmixed, reverbed audio signal, where N is a number less than Y; wherein the post-mix subsystem is configured to use a post-mix matrix comprising time-varying coefficients determined in response to the spatial cue parameters.

20. The reverberator of claim 13, also including:

a head-related transfer function filter coupled and configured to apply at least one head-related transfer function to each of the reverbed channel signals.

21. The reverberator of claim 13, also including:

a post-mix subsystem coupled and configured to downmix the reverbed channel signals and apply at least one head-related transfer function to each of the reverbed channel signals, thereby generating an N-channel, downmixed, reverbed audio signal, where N is a number less than Y.

22. The reverberator of claim 13, wherein the reverb application subsystem includes:

a set of Y delay and gain elements, having Y outputs at which the reverbed channel signals are asserted and having Y inputs;

a set of Y addition elements, each of the addition elements having a first input coupled to a different output of the first subsystem, a second input coupled to receive a different one of the reverbed channel signals, and an output;

a scattering matrix having matrix inputs coupled to the outputs of the addition elements, and matrix outputs coupled to the inputs of the delay and gain elements, wherein the scattering matrix is configured to assert a filtered version of the output of each of the addition elements to the input of a corresponding one of the delay and gain elements.

23. The reverberator of claim 22, also including a post-mix subsystem, coupled to the outputs of the delay and gain elements and coupled to receive at least a subset of the spatial cue parameters, and configured to downmix the reverbed channel signals in response to said at least a subset of the spatial cue parameters, thereby generating an N-channel, downmixed, reverbed audio signal, where N is a number less than Y.

* * * * *